(12) United States Patent
Chu et al.

(10) Patent No.: US 6,265,233 B1
(45) Date of Patent: Jul. 24, 2001

(54) METHOD FOR DETERMINING CRACK LIMIT OF FILM DEPOSITED ON SEMICONDUCTOR WAFER

(75) Inventors: Jason C. S. Chu, Yunghe; Jerry C. S. Lin, Tainan; Roger Tun-Fu Hung, Fengshan; Chih-Ta Wu, Hsinchu, all of (TW)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

(21) Appl. No.: 09/326,096

(22) Filed: Jun. 4, 1999

(30) Foreign Application Priority Data

Feb. 22, 1999 (TW) ................................. 88102577

(51) Int. Cl.$^7$ .................................................. G01R 31/26
(52) U.S. Cl. .......................................... 438/14; 324/158.1
(58) Field of Search ................... 324/72.5, 754, 324/158.1; 438/14

(56) References Cited

U.S. PATENT DOCUMENTS

| | | | | |
|---|---|---|---|---|
| 4,249,988 | * | 2/1981 | Lavigna ................................. | 117/21 |
| 5,212,111 | * | 5/1993 | Doan ..................................... | 438/450 |
| 5,554,390 | * | 9/1996 | Anne ..................................... | 428/631 |
| 5,719,495 | * | 2/1998 | Moslehi ............................. | 324/158.1 |
| 5,795,378 | * | 8/1998 | Sakamoto ......................... | 106/287.16 |
| 5,854,302 | * | 12/1998 | Foster ................................. | 522/172 |
| 6,091,131 | * | 7/2000 | Cook ................................... | 257/629 |
| 6,174,814 | * | 1/2001 | Cook ................................... | 438/692 |

\* cited by examiner

Primary Examiner—John F. Niebling
Assistant Examiner—André Stevenson
(74) Attorney, Agent, or Firm—Dike, Bronstein, Roberts & Cushman Intellectual Property Group; David G. Conlin; Peter F. Corless

(57) ABSTRACT

A method for determining a crack limit of a target film deposited on a wafer in production after a post annealing procedure is disclosed. The crack limit is determined by adopting and adjusting the thermal shrinkage rates of a plurality of target films deposited on bare wafers and annealed. The test results on bare wafers can be applied to the production wafers to prevent from film cracking and/or inspect instrumental conditions.

8 Claims, No Drawings

METHOD FOR DETERMINING CRACK LIMIT OF FILM DEPOSITED ON SEMICONDUCTOR WAFER

FIELD OF THE INVENTION

The present invention is related to a method for determining a crack limit of a film deposited on a semiconductor wafer, and more particularly to a method for determining a crack limit of an undoped silicon glass (USG) film deposited on a wafer by a chemical vapor deposition (CVD) process.

BACKGROUND OF THE INVENTION

An undoped silicon glass (USG) film deposited by a chemical vapor deposition (CVD) process has been widely used in the field of IC fabrication as a shallow trench isolation (STI) gap fill, sidewall spacer, inter-metal dielectric (IMD) or passivation dielectric. For the CVD process, $O_3$/TEOS is preferred over $SiH_4$ due to better gap fill or step coverage capability as well as safety consideration. On the other hand, a sub atmosphere (SA) CVD process is prior to an atmosphere (AP) CVD process and a plasma enhanced (PE) CVD process to serve as the deposition technique for depositing the USG film because of the better balance in the deposition rate and the gap fill capability. Therefore, so far, an SA $O_3$/TEOS process is commonly used for the deposition of a USG film.

The SA $O_3$/TEOS process, however, still suffers from a drawback that the as-deposited film is porous and inclined to absorb moisture. Therefore, a post annealing procedure will be necessary to densify the film. In the meantime, the within film tensile stress is subject to elevation during the thermal annealing procedure so as to cause the film crack. Therefore, the situation of the USG film during the IC production is generally checked to detect or even prevent the crack of the film, and it is preferred to adopt a non-destructive method.

Several parameters of the within film such as the deposition rate and the HF etching rate have been monitored to determine the crack limit of the film in order to prevent from cracking, but none of them is sensitive enough to serve as an indicator to achieve this purpose. In addition, a painstaking scanning electron microscope (SEM) process can be used to check the situation of the USG film via an off line operation, and the SEM results generally tell the crack situation of the film rather than prevent it.

SUMMARY OF THE INVENTION

Therefore, an object of the present invention is to provide a method for determining a crack limit of a film deposited on a semiconductor wafer without any destruction.

Another object of the present invention is to provide a method sensitive and effective to determine a crack limit of a film deposited on a semiconductor wafer.

A further object of the present invention is to provide a method for determining a crack limit of a film deposited on a semiconductor wafer, which is performed prior to the IC production so that no more off line inspection is required.

According to the present invention, a method for determining a crack limit of a target film deposited on a wafer in production after a post annealing procedure includes steps of:

a) forming a plurality of target films on respective bare wafers;

b) annealing the bare wafers with the target films;

c) detecting thermal shrinkage rates of the annealed target films; and d) determining the crack limit according to the thermal shrinkage rates of the annealed target films.

Preferably, the plurality of target films are formed on the respective bare wafers with at least two kinds of thickness in order to make the test results on the bare wafers as complete as possible.

For obtaining comparable results, the conditions for forming and annealing the target films on the bare wafers are preferably identical to those for forming and annealing the target film on the wafer in production.

In the step c), each of the thermal shrinkage rates (SR) of the annealed target films is defined by an equation of $SR=(T1-T2)/T1$, in which T1 indicates the thickness of a target film detected before the annealing procedure, and T2 indicates the thickness of a target film detected after the annealing procedure.

After the thermal shrinkage rates are determined in the step c), the crack limit can be determined for example by selecting the highest one of the thermal shrinkage rates of the annealed target films which do not crack as a threshold value, and subtracting a buffer value from the threshold value to have the crack limit. The presence of the buffer value is for further assuring of the perfection of the target film on the wafer in production when the test results on bare wafers are applied to the production wafers. As for the selection of the buffer value, it can be made by a trial and error method, or as large as possible provided that other desired properties are not influenced significantly.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

First of all, nine bare wafers are provided and deposited thereon USG films of three kinds of thickness in an SACVD system. The chemical precursor used in the SACVD system is $O_3$/TEOS. The three kinds of thickness are 4.5 kÅ, 6 kÅ and 7 kÅ, each for three samples. After the USG films are formed on the bare wafers, they are subjected to a post annealing procedure at about 800° C.

After the annealing procedure, the thickness of all the nine samples or only the samples which do not crack is measured and compared with the thickness thereof before annealing to calculate their respective thermal shrinkage rates. The thermal shrinkage rate (SR) is defined by an equation of:

$$SR=(T1-T2)/T1$$

in which T1 indicates the thickness of a target film detected before the annealing procedure, and T2 indicates the thickness of a target film detected after the annealing procedure. For example, for one of the samples having the thickness of 4.5 kÅ before annealing, the thickness thereof after annealing is measured as about 4.07 kÅ, so the thermal shrinkage rate SR will be equal to $(4.5-4.07)/4.5 \approx 9.56\%$.

In this embodiment, the three kinds of thickness are used for making the test results on the bare wafers as complete as possible. Furthermore, when choosing the thickness of the USG films to be deposited on the bare wafers, it is preferred to have at least one kind of the thickness approximate to the real USG films to be deposited on the production wafers. By this way, the test results on bare wafers will be more suitable for the production wafers. In addition, for obtaining comparable results, the conditions for forming and annealing the target films on the bare wafers are preferably identical to those for forming and annealing the target film on the wafer in production.

From the thermal shrinkage rate data, the highest one of the thermal shrinkage rates of the annealed target films which do not crack is selected as a threshold value. Then, a crack limit is determined by subtracting a buffer value from the threshold value. For example, for the above USG films deposited on bare wafers in the SACVD system with an ozone flow rate of about 4000 sccm, and annealed at a temperature of about 800° C., the threshold value summarized from the thermal shrinkage rates of the nine samples is about 9.7%. Because the crack limit indicated by thermal shrinkage rate for being applied to USG films deposited on production wafers is determined according to the thermal shrinkage rates of the USG films deposited on bare wafers, the threshold value had better be slightly adjusted to obtain the crack limit in order to make sure that the test results on bare wafers can be perfectly applied to the production wafers. Therefore, a buffer value is preferably present to modify the threshold value to obtain the crack limit which is to be applied to the real manufacturing process. As for the selection of the buffer value, it can be made by a trial and error method, or as large as possible provided that other desired properties are not influenced significantly. In this embodiment, a buffer value is chosen as 2%. In other words, the crack limit for the USG film deposited on the wafer in production after a post annealing procedure is determined as about 9.5% by thermal shrinkage rate. After the crack limit is determined, the film cracking on the production wafers can be avoided, and the instrumental conditions can be inspected and tuned accordingly.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for determining a crack limit of a target film deposited on a production wafer after a post annealing procedure, comprising steps of:

a) providing a plurality of test wafers;
 b) forming a plurality of test films of the same material as said target film to be deposited on said production wafer on said plurality of test wafers, respectively, on the condition that said plurality of test films includes at least two kinds of thickness;
 c) annealing said test wafers with said test films;
 d) observing whether said annealed test films crack, and detecting thermal shrinkage rate data of said annealed test films; and
 e) determining said crack limit of said target film deposited on said production wafer according to said thermal shrinkage rate data of said annealed test films deposited on said test wafers.

2. The method according to claim 1 wherein in said step b), conditions for forming said test films on said test wafers are identical to those for forming said target film on said production wafer.

3. The method according to claim 2 wherein in said step c), conditions for annealing said test films on said test wafers are identical to those for annealing said target film on said production wafer.

4. The method according to claim 1 wherein in said step d), said thermal shrinkage rate (SR) data of said annealed test films is calculated by an equation of:

$$SR=(T1-T2)/T1$$

in which T1 indicates the thickness of a test film detected before said annealing procedure, and T2 indicates the thickness of a test film detected after said annealing procedure.

5. The method according to claim 1 wherein in said step e), said crack limit is determined by selecting the highest thermal shrinkage rate among said themal shrinkage rate data of said annealed test films which do not crack as a threshold value, and subtracting a buffer value from said threshold value to have said crack limit.

6. The method according to claim 5 wherein said thermal shrinkage rate data includes thermal shrinkage rates of all of said annealed test films.

7. The method according to claim 5 wherein said thermal shrinkage rate data includes thermal shrinkage rates of all annealed test films which do not crack.

8. The method according to claim 1 wherein at least one of said test films has a thickness substantially equal to a thickness of said target film before annealing.

* * * * *